(12) United States Patent
Kurosawa et al.

(10) Patent No.: US 9,928,920 B2
(45) Date of Patent: Mar. 27, 2018

(54) MEMORY CONTROLLER, STORAGE DEVICE, AND READ RETRY METHOD

(71) Applicant: Toshiba Memory Corporation, Minato-ku (JP)

(72) Inventors: Yasuhiko Kurosawa, Fujisawa (JP); Tsuyoshi Atsumi, Ota (JP); Masanobu Shirakawa, Chigasaki (JP); Tokumasa Hara, Kawasaki (JP); Naoya Tokiwa, Fujisawa (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 64 days.

(21) Appl. No.: 14/976,842

(22) Filed: Dec. 21, 2015

(65) Prior Publication Data

US 2017/0076810 A1    Mar. 16, 2017

Related U.S. Application Data

(60) Provisional application No. 62/216,738, filed on Sep. 10, 2015.

(51) Int. Cl.

| | |
|---|---|
| *G11C 16/34* | (2006.01) |
| *G06F 11/10* | (2006.01) |
| *G11C 29/52* | (2006.01) |
| *G06F 3/06* | (2006.01) |
| *G11C 16/26* | (2006.01) |
| *G11C 7/04* | (2006.01) |

(Continued)

(52) U.S. Cl.
CPC .......... *G11C 16/3404* (2013.01); *G06F 3/064* (2013.01); *G06F 3/0619* (2013.01); *G06F 3/0653* (2013.01); *G06F 3/0679* (2013.01); *G06F 11/1068* (2013.01); *G11C 7/04* (2013.01); *G11C 11/5642* (2013.01); *G11C 16/0483* (2013.01); *G11C 16/26* (2013.01); *G11C 29/52* (2013.01)

(58) Field of Classification Search
None
See application file for complete search history.

(56) References Cited

U.S. PATENT DOCUMENTS

| | | | |
|---|---|---|---|
| 7,663,905 B2 * | 2/2010 | Shuto | G11C 7/04 365/145 |
| 7,911,864 B2 | 3/2011 | Itoh | |
| 8,208,333 B2 | 6/2012 | Itoh | |

(Continued)

FOREIGN PATENT DOCUMENTS

| | | |
|---|---|---|
| JP | 11-297084 | 10/1999 |
| JP | 2009-123292 | 6/2009 |
| JP | 5693615 | 4/2015 |

*Primary Examiner* — Mujtaba M Chaudry
(74) *Attorney, Agent, or Firm* — Oblon, McClelland, Maier & Neustadt, L.L.P.

(57) ABSTRACT

According to one embodiment, a temperature of a non-volatile memory or an ambient temperature of the non-volatile memory is acquired. A distribution of a threshold voltage, which is corrected according to the acquired temperature, is acquired from the non-volatile memory. Read voltages related to the reading of data are detected from the distribution. Error correction is performed for data read from the non-volatile memory, using the read voltages. The detected read voltages are separately corrected on the basis of the acquired temperature when the error correction has failed.

20 Claims, 8 Drawing Sheets

(51) Int. Cl.
*G11C 16/04*   (2006.01)
*G11C 11/56*   (2006.01)

(56) References Cited

U.S. PATENT DOCUMENTS

| | | |
|---|---|---|
| 8,213,255 B2 | 7/2012 | Hemink et al. |
| 9,036,438 B2 | 5/2015 | Hemink et al. |
| 2007/0211512 A1* | 9/2007 | Shuto ................ G11C 7/04 365/145 |
| 2010/0199149 A1* | 8/2010 | Weingarten ........ G06F 11/1068 714/773 |
| 2011/0219203 A1* | 9/2011 | Nurminen ............. G11C 7/04 711/165 |
| 2012/0155168 A1* | 6/2012 | Kim .................... G11C 5/14 365/185.03 |
| 2012/0239976 A1* | 9/2012 | Cometti ............... G11C 16/26 714/24 |
| 2015/0043281 A1 | 2/2015 | Hemink et al. |

* cited by examiner

MEMORY CONTROLLER, STORAGE DEVICE, AND READ RETRY METHOD

CROSS-REFERENCE TO RELATED APPLICATIONS

This application is based upon and claims the benefit of priority from U.S. Provisional Application No. 62/216,738, filed on Sep. 10, 2015; the entire contents of which are incorporated herein by reference.

FIELD

Embodiment described herein relate generally to a memory controller, a storage device, and a read retry method.

BACKGROUND

In a non-volatile memory which is typified by a NAND flash memory, information is stored by the amount of charge stored in a floating gate of a memory cell. The stored information can be read by applying an appropriate voltage (read voltage) to the memory cell. The read voltage is detected from the shape of the distribution of the threshold voltage of each memory cell.

However, it has been known that the physical properties of the non-volatile memory (memory cell) vary depending on the temperature. Therefore, in the related art, when the read voltage is detected, temperature correction is performed to correct the distribution according to the temperature of the non-volatile memory or the ambient temperature of the non-volatile memory. However, in the temperature correction according to the related art, there is a possibility that it is not possible to obtain an appropriate read voltage.

DETAILED DESCRIPTION

In general, according to one embodiment, a memory controller includes a temperature acquiring processor, a distribution acquiring processor, a detector, a decoder, and a temperature correcting processor. The temperature acquiring processor acquires a temperature of a non-volatile memory or an ambient temperature of the non-volatile memory. The distribution acquiring processor acquires a distribution of a threshold voltage, which is corrected according to the temperature acquired by the temperature acquiring processor, from the non-volatile memory. The detector detects read voltages related to the reading of data from the distribution. The decoder performs error correction for data read from the non-volatile memory, using the read voltages. The temperature correcting processor separately corrects the read voltages detected by the detector on the basis of the temperature acquired by the temperature acquiring processor when the error correction has failed.

Hereinafter, a memory controller, a storage device, and a read retry method according to embodiments will be described with reference to the accompanying drawings. The invention is not limited by the embodiments.

First Embodiment

Figure 1:
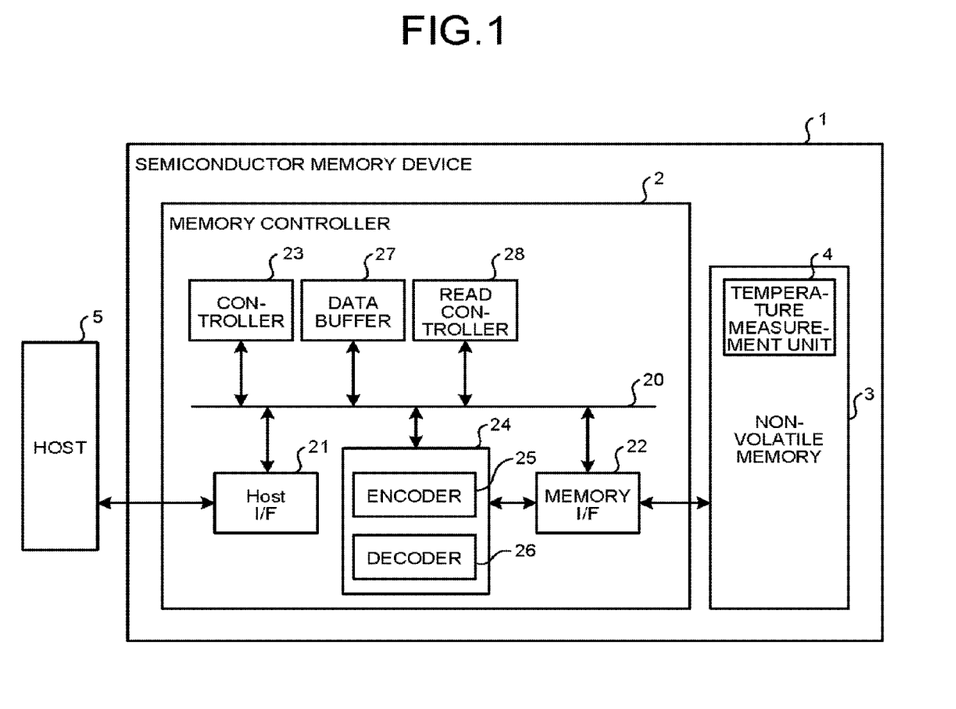
FIG. 1 is a block diagram illustrating an example of the structure of a storage device according to a first embodiment.

FIG. 1 is a block diagram illustrating an example of the structure of a storage device (semiconductor memory device) according to a first embodiment. A semiconductor memory device 1 according to this embodiment includes a memory controller 2, a non-volatile memory 3, and a temperature measurement unit 4. The semiconductor memory device 1 can be connected to a host 5. The host 5 is an information processing apparatus such as a personal computer or a portable terminal. FIG. 1 illustrates a state in which the semiconductor memory device 1 is connected to the host 5.

The non-volatile memory 3 is a non-volatile memory such as a NAND flash memory. The non-volatile memory 3 includes a plurality of memory cells (not illustrated) which are arranged in a matrix. The non-volatile memory 3 stores information using the amount of charge stored in a floating gate of the memory cell. A read voltage, which will be described below, can be applied to the memory cell to read the stored information. In this embodiment, an example in which a NAND flash memory is used as the non-volatile memory 3 will be described. However, the embodiment is not limited thereto.

The non-volatile memory 3 includes the temperature measurement unit 4. The temperature measurement unit 4 is a temperature sensor that measures the temperature of the non-volatile memory 3. The temperature measurement unit 4 outputs the measured temperature as temperature information to the memory controller 2 (read controller 28) through a memory I/F 22. In addition, the data format of the temperature information is not particularly limited and the temperature information may be a digital value or an analog value.

The memory controller 2 controls the writing of data to the non-volatile memory 3 in response to a write command from the host 5. In addition, the memory controller 2 controls the reading of data from the non-volatile memory 3 in response to a read command from the host 5. The memory controller 2 includes, for example, a Host I/F 21, the memory I/F 22, a controller 23, an encoding/decoding unit 24, a data buffer 27, and a read controller 28. The units of the memory controller 2 are connected to each other through an internal bus 20.

The Host I/F 21 outputs, for example, commands and data (user data) to be written, which are received from the host 5, to the internal bus 20. In addition, the Host I/F 21 transmits the data which has been read from the non-volatile memory 3 and then decoded by the encoding/decoding unit 24 (decoder 26) to the host 5.

The controller 23 is a processor such as a central processing unit (CPU) or a micro processing unit (MPU). The controller 23 controls the overall operation of the semiconductor memory device 1. When receiving a command from the host 5 through the Host I/F 21, the controller 23 performs a control process corresponding to the command.

For example, when receiving a write request from the host 5, the controller 23 instructs an encoder 25 to encode the user data to be written. Then, the controller 23 instructs the memory I/F 22 to write the data (encoded data) encoded by the encoder 25 to the non-volatile memory 3. In addition, the controller 23 manages the write destination of the encoded data in the non-volatile memory 3 (a physical address in the non-volatile memory 3).

For example, when receiving a read request from the host 5, the controller 23 instructs the memory I/F 22 to read data from the non-volatile memory 3. Then, the controller 23 instructs the decoder 26 to decode the data read from the non-volatile memory 3. The memory I/F 22 performs the writing of data to the non-volatile memory 3 or the reading of data from the non-volatile memory 3 under the control of the controller 23.

The encoding/decoding unit 24 includes the encoder 25 and the decoder 26. The encoder 25 encodes the data to be written to the non-volatile memory 3, using, for example, a low density parity check (LDPC) code. The error correction codes used by the encoder 25 are not limited to the LDPC codes and the encoder 25 may use other error correction codes such as Bose Chaudhuri Hocquenghem (BCH) codes.

The decoder 26 decodes the encoded data read from the non-volatile memory 3 under the control of the memory controller 2. When decoding the encoded data, the decoder 26 performs error detection and error correction (hereinafter, referred to as an error correction process) on the basis of the error correction codes. When it is determined that the error correction process has failed, the decoder 26 notifies the read controller 28 of a failure signal. A method for determining whether the error correction process has succeeded is not particularly limited. For example, when the number of errors in the encoded data exceeds the capability of the error correction process, the decoder 26 determines that the error correction process has failed. In addition, the decoder 26 performs an error correction process such as LDPC.

The data buffer 27 temporarily stores the user data received from the host 5 before the user data is stored in the non-volatile memory 3 or temporarily stores the data read from the non-volatile memory 3 before the data is transmitted to the host 5. The data buffer 27 is a general-purpose memory such as a static random access memory (SRAM) or a dynamic random access memory (DRAM).

The read controller 28 controls a read voltage (which will be described below) related to the reading of data from the non-volatile memory 3. Specifically, the read controller 28 performs a process for correcting the read voltage (hereinafter, referred to as a retry process) according to the failure signal notified from the decoder 26. The read controller 28 will be described in detail below.

The encoding/decoding unit 24 (the encoder 25 and the decoder 26) and the read controller 28 among the units of the memory controller 2 may be implemented by the cooperation between a processor and a certain program in the controller 23 or by a dedicated electronic circuit which is designed to implement a certain function. FIG. 1 illustrates an example of the structure including the encoding/decoding unit 24 and the memory I/F 22. However, the embodiment is not limited thereto. For example, the encoding/decoding unit 24 may be provided in the memory I/F 22. In addition, the read controller 28 may be provided in any one of the memory I/F 22, the controller 23, and the encoding/decoding unit 24.

Figure 2:
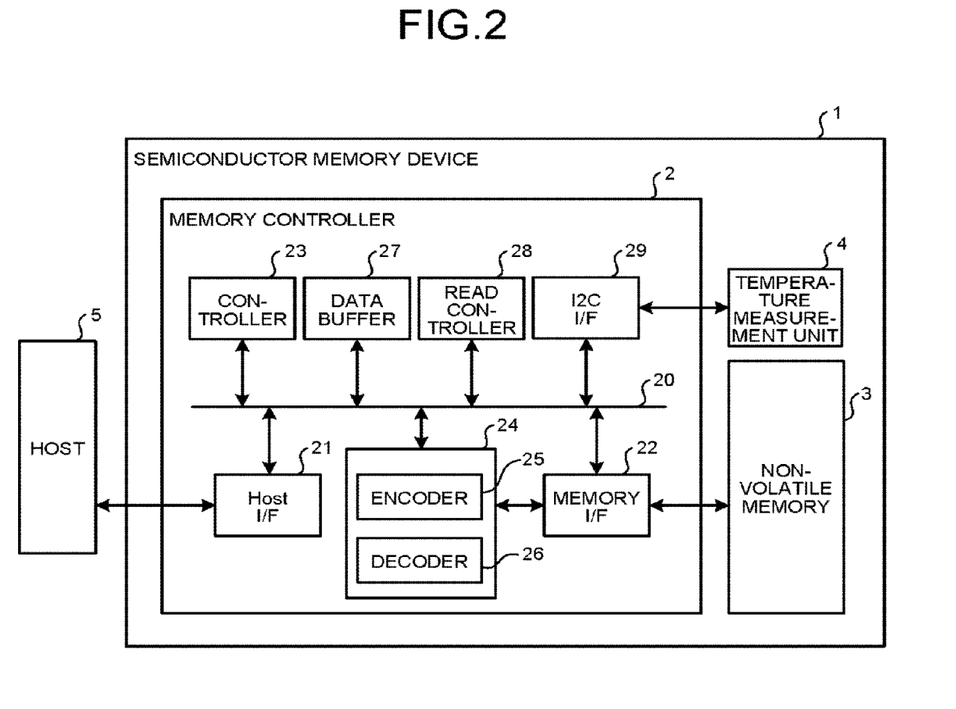
FIG. 2 is a block diagram illustrating another example of the structure of the storage device according to the first embodiment.

FIG. 1 illustrates the structure in which the non-volatile memory 3 includes the temperature measurement unit 4. However, the embodiment is not limited thereto. The temperature measurement unit 4 may be provided outside the non-volatile memory 3. When this structure is used, for example, as illustrated in FIG. 2, the temperature measurement unit 4 is connected to the internal bus 20 through an interface such as an inter integrated circuit (I2C) I/F 29. The temperature measurement unit 4 is provided in the vicinity of the non-volatile memory 3 and measures the temperature of the non-volatile memory 3 or the temperature of a peripheral circuit of the non-volatile memory 3. The temperature measurement unit 4 outputs the measured temperature as temperature information to the memory controller 2 (read controller 28) through the I2C I/F 29. The type of temperature measurement unit 4 (temperature sensor) is not particularly limited. For example, ADM-1021A manufactured by On Semiconductor Corporation may be used as the temperature measurement unit 4.

However, in the case of a NAND flash memory, a current flows to each memory cell when a voltage that is equal to or greater than a voltage value corresponding to the amount of charge in the floating gate is applied to the memory cell and no current flows to each memory cell when a voltage that is less than the voltage value is applied to the memory cell. This boundary voltage is referred to as a threshold voltage. Data to be stored in each memory cell corresponds to the distribution of a plurality of threshold voltages (hereinafter, referred to as a threshold value distribution). When data is written, an electron is injected according to the data value such that the memory cell corresponds to any of the threshold value distributions.

Figure 3:
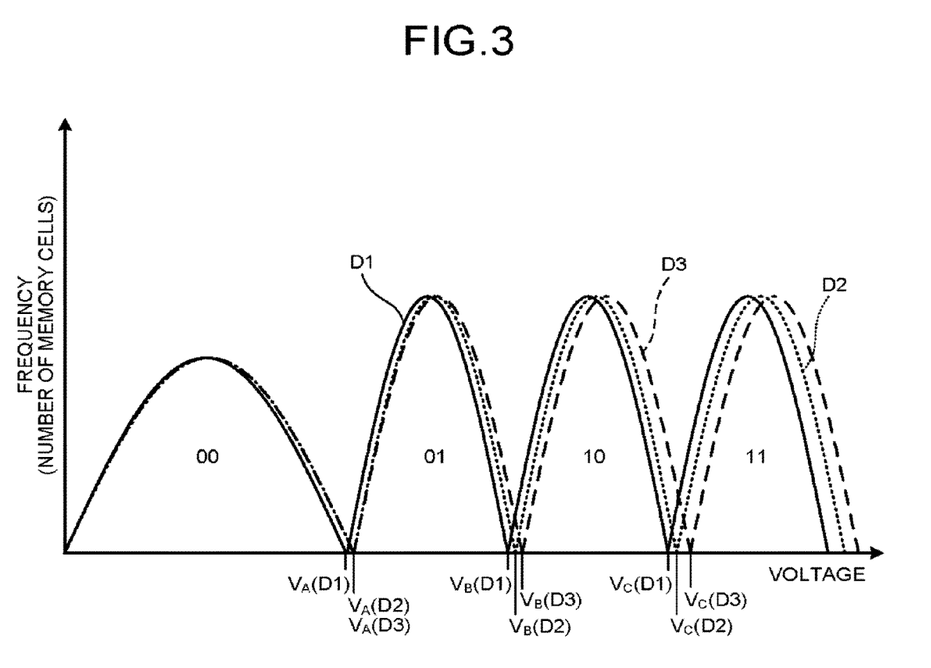
FIG. 3 is a diagram schematically illustrating an example of a threshold value distribution.

Next, the threshold value distribution of the NAND flash memory will be described with reference to FIG. 3. FIG. 3 is a diagram schematically illustrating an example of the threshold value distribution. The vertical axis indicates frequency (the number of memory cells) and the horizontal axis indicates a voltage (threshold voltage) which is observed by the memory controller 2. The meaning of the term "observation by the memory controller 2" includes a case in which a voltage before correction is observed by the non-volatile memory 3 and a case in which a voltage after correction is observed by the non-volatile memory 3.

For example, in the case of a 2-bit cell in which one memory cell stores 2 bits, there are four threshold value distributions corresponding to bit values "00", "01", "10", and "11". When data is read from the memory cell, a voltage value (read voltage) which separates the threshold value distributions is applied to determine the position of data. Specifically, as in a threshold value distribution D1, voltage values with levels (A, B, and C) corresponding to valleys between the threshold value distributions are used as read voltages $V_A$, $V_B$, and $V_C$ to read data in an optimum state in which the number of errors is the minimum. Here, the threshold value distribution D1 is illustrated as an example of the threshold voltage (threshold value distribution) which is observed at a temperature T1.

The read voltage can be specified by, for example, the following method (hereinafter, referred to as Vth tracking). First, a distribution read process which reads data while applying a voltage with a certain voltage width to each of the memory cells forming the non-volatile memory 3 is performed to acquire the threshold value distribution D1. The distribution read process is a process for acquiring a distribution (threshold value distribution) indicating the relationship between a voltage (horizontal axis) applied to a control gate (CG) of the memory cell and the total number of memory cells in an on state (vertical axis). Voltage values corresponding to valley portions of each level are detected as read voltages $V_A(D1)$, $V_B(D1)$, and $V_C(D1)$ on the basis of the shape of the acquired threshold value distribution D1.

However, it has been known that the physical properties of the non-volatile memory 3 (memory cell) vary depending on the temperature. Therefore, the voltage value is corrected depending on the temperature inside the non-volatile memory 3. However, the correction value is not reflected in the distribution read process. For this reason, when performing the distribution read process, the memory controller 2 corrects a predetermined voltage value according to the temperature of the non-volatile memory 3 or the temperature of the peripheral circuit of the non-volatile memory 3. Then, the memory controller 2 applies the corrected voltage value to the non-volatile memory 3 to perform the distribution read process. For example, when the temperature of the non-volatile memory 3 changes from the temperature T1 to a temperature T2, the memory controller 2 performs correction (temperature correction) using a correction value based on a temperature difference (T2-T1) and a certain temperature coefficient $T_{coA}$.

However, in the temperature correction, there is a possibility that it is not possible to obtain a read voltage at which the number of errors is the minimum from the result of the distribution read process. Hereinafter, this problem will be described with reference to FIG. 3.

In the temperature correction, the distribution read process is performed on the basis of the correction value (temperature coefficient) corresponding to the temperature. The correction value used in the distribution read process is set on the basis of the changing tendency of the read voltage with a reference level depending on the temperature. For example, when correction is performed with a temperature coefficient $T_{coA}$ at which the reference level is a level A, with a change in the temperature from the temperature T1 to the temperature T2, a threshold value distribution D2 is obtained by the distribution read process. Here, the threshold value distribution D2 illustrates an example of the threshold voltage (threshold value distribution) which is observed after the correction with the temperature coefficient $T_{coA}$ at the temperature T2.

Read voltages $V_A(D2)$, $V_B(D2)$, and $V_C(D2)$ after correction are detected from the threshold value distribution D2. Here, the read voltages $V_A(D2)$, $V_B(D2)$, and $V_C(D2)$ detected from the threshold value distribution D2 are obtained by shifting the read voltages $V_A(D1)$, $V_B(D1)$, and $V_C(D1)$ in the threshold value distribution D1 in the positive direction by a correction value (corresponding to a shift value $V_{A1}$ which will be described below) corresponding to the temperature coefficient $T_{coA}$. That is, in the distribution read process, the correction based on the level A is also performed for a level B and a level C. In the general reading of the level B or the level C, correction is performed with a temperature coefficient corresponding to each level.

However, in some cases, the changing tendency of the read voltage with levels other than the reference level depending on the temperature is different from the changing tendency of the read voltage with the reference level depending on the temperature. In this case, when the distribution read process is performed, it is possible to obtain an appropriate voltage value for minimizing the number of errors for the read voltage $V_A(D2)$ with the reference level. However, it is difficult to obtain an appropriate voltage value for the read voltages $V_B(D2)$ and $V_C(D2)$ with other levels. That is, the threshold value distribution obtained by the distribution read process is likely to be different from the threshold value distribution (the original threshold value distribution) obtained by a method for directly observing the state of the non-volatile memory 3 (memory cell), such as a multi-level cell (MLC) read method.

For example, it is assumed that a threshold value distribution D3 illustrated in FIG. 3 is the original threshold value distribution of the non-volatile memory 3 at the temperature T2. In this case, the read voltage $V_A(D2)$ with the reference level (level A) is equal to the read voltage $V_A(D3)$ with the level A in the threshold value distribution D3. On the other hand, the read voltage $V_B(D2)$ and the read voltage $V_C(D2)$ deviate from the read voltage $V_B(D3)$ with the level B and the read voltage $V_C(D3)$ with the level C in the threshold value distribution D3, respectively.

The memory controller 2 (read controller 28) according to this embodiment separately corrects the read voltages detected by Vth tracking (distribution read process) to an appropriate read voltage corresponding to the original threshold value distribution. Next, the read controller 28 will be described in detail.

Figure 4:
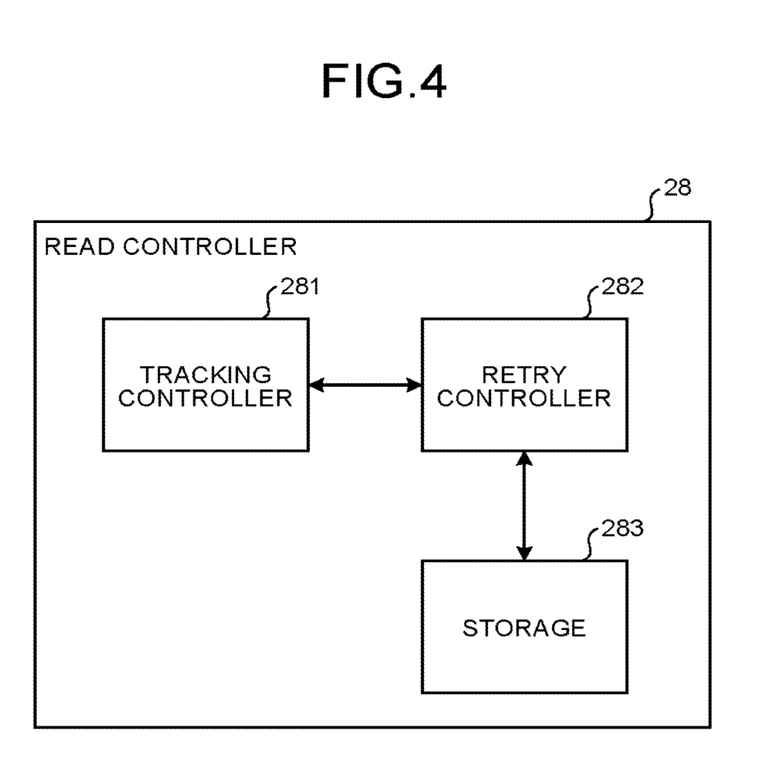
FIG. 4 is a diagram illustrating an example of the functional structure of a read controller according to the first embodiment.

FIG. 4 is a diagram illustrating an example of the functional structure of the read controller 28. As illustrated in FIG. 4, the read controller 28 includes a tracking processor 281, a retry processor 282, and a storage 283.

The tracking processor 281 performs the distribution read process for the non-volatile memory 3 to perform Vth tracking. The tracking processor 281 can perform two types of Vth tracking, that is, simple tracking for acquiring the threshold value distribution of a specific level and full-level tracking for acquiring the threshold value distribution of all levels. The tracking processor 281 detects a voltage value corresponding to a valley portion of each level as the read voltage, on the basis of the shape of the acquired threshold value distribution. When performing the simple tracking, the tracking processor 281 can derive (estimate) the read voltages with other levels or a shift value, which will be described below, from, for example, the characteristics of the acquired threshold value distribution of the specific level, using a known technique.

The tracking processor 281 adds the correction value to a predetermined voltage value, according to the temperature (temperature information) measured by the temperature measurement unit 4, and applies a value with the added (corrected) voltage value to the memory cell to perform Vth tracking (distribution read process). For example, the tracking processor 281 calculates a correction value (hereinafter, referred to as a shift value) $V_{A1}$ related to the correction of the voltage value, on the basis of the following Basic Expression (1).

$$V_{A1} = C \times T_{co\_Dist} \times (T_N - T_{B1}) \quad (1)$$

In Expression (1), C is an arbitrary constant. In addition, $T_{co\_Dist}$ is a temperature coefficient [mV/° C.] when the reference level is the level A. Furthermore, $T_N$ is a temperature [° C.] indicated by the temperature information of the temperature measurement unit 4 and $T_{B1}$ is a first reference temperature [° C.]. The first reference temperature is not particularly limited. However, for example, the first reference temperature may be a temperature (set temperature) which is designated by the manufacturer of the non-volatile memory 3. In addition, it is assumed that C or the temperature coefficient in Basic Expression (1) are predetermined on the basis of, for example, the tendency of temperature change, such that the read voltage $V_A$ after correction is positioned between the threshold value distributions (valley portions) of "00" and "01".

For example, when $T_{B1}$ is 80 [° C.], $T_N$ is 40 [° C.], and $T_{co\_Dist}$ is −1.0 [mV/° C.], the shift value $V_{A1}$ is calculated on the basis of Basic Expression (1) as follows:

$$V_{A1}=C \times (-1.0) \times (40-80) = 40 \times C \text{[mV]}.$$

Then, the tracking processor 281 detects each read voltage in which the shift value is reflected, from the threshold value distribution obtained by the distribution read process.

When the decoder 26 has failed in the error correction process, the retry processor 282 performs a retry process (read retry) of changing the voltage value of the read voltage in cooperation with the tracking processor 281.

Specifically, when the failure signal is notified from the decoder 26, the retry processor 282 instructs the tracking processor 281 to perform simple tracking. The retry processor 282 sets the read voltage detected by the simple tracking to the memory I/F 22. The read voltage set to the memory I/F 22 is stored as the set value and is used to access the non-volatile memory 3 (for example, to read data).

When the failure signal is notified from the decoder 26, the retry processor 282 instructs the tracking processor 281 to perform full-level tracking for the read voltage after the simple tracking.

Here, it is assumed that the shift value $V_{A1}$ corresponding to the reference level (read voltage $V_A$) is reflected in the threshold value distribution acquired by the simple tracking or the full level tracking. Therefore, the read voltage $V_A$ is corrected to an appropriate voltage value at which the number of errors is the minimum, but the other read voltages $V_B$ and $V_C$ are not corrected to the appropriate voltage value.

The retry processor 282 separately corrects the read voltages ($V_B$ and $V_C$) with levels other than the reference level to appropriate voltage values, on the basis of the temperature measured by the temperature measurement unit 4.

Specifically, the retry processor 282 calculates correction values $V_{B1}$ and $V_{C1}$ related to the correction of the read voltages $V_B$ and $V_C$, respectively, on the basis of the following Expressions (2) and (3).

$$V_{B1}=C \times (T_{coA}+T_{coB}) \times (T_N-T_{B1}) \quad (2)$$

$$V_{C1}=C \times (T_{coA}+T_{coB}+T_{coC}) \times (T_N-T_{B1}) \quad (3)$$

In Expressions (2) and (3), C is an arbitrary constant and $T_{coA}$, $T_{coB}$, and $T_{coC}$ are temperature coefficients [mV/° C.]. In addition, $V_{B1}$ is a correction value [mV] for correcting the read voltage $V_B$ and $V_{C1}$ is a correction value [mV] for correcting the read voltage $V_C$. It is assumed that the value of C or the temperature coefficient in Expression (2) is set in advance on the basis of, for example, the tendency of temperature change, such that the corrected read voltage $V_B$ is positioned between the threshold value distributions (valley portions) of "01" and "10". Furthermore, it is assumed that the value of C or the temperature coefficient in Expression (3) is set in advance on the basis of, for example, the tendency of temperature change, such that the corrected read voltage $V_C$ is positioned between the threshold value distributions (valley portions) of "10" and "11".

The retry processor 282 adds the correction value $V_{B1}$ to the read voltage $V_B$ detected by the full-level tracking to correct the voltage value. In addition, the retry processor 282 adds the correction value $V_{C1}$ to the read voltage $V_C$ detected by the full-level tracking to correct the voltage value.

For example, when $T_{B1}$ is 80 [° C.], $T_N$ is 38 [° C.], C is 5, $T_{coA}$ is 0.1, $T_{coB}$ is 0.2, and $T_{coC}$ is 0.3, the correction value $V_{C1}$ during the first correction process is calculated on the basis of the above-mentioned Expression (3) as follows:

$$V_{C1}=5 \times (0.1+0.2+0.3) \times (38-80) = -126.$$

When the read voltage $V_C$ detected by the full-level tracking is 251 [mV] and the correction value $V_{C1}$ is −126 [mV], the retry processor 282 calculates 125 [mV] as the corrected read voltage $V_C$.

Then, when the read voltage $V_A$ which has been detected by the full-level tracking and corrected on the basis of Basic Expression (1) and the read voltages $V_B$ and $V_C$ which have been corrected on the basis of Expressions (2) and (3), respectively, are set in the memory I/F 22, the retry processor 282 controls the decoder 26 such that soft-decision decoding is performed.

Then, the retry processor 282 stores the corrected read voltages $V_B$ and $V_C$ and the temperature information acquired during the correction in the storage 283. Then, the retry processor 282 performs new correction, using the temperature information and the read voltages $V_B$ and $V_C$ stored in the storage 283.

When the temperature information and the read voltages $V_B$ and $V_C$ have been stored in the storage 283, that is, when the second and subsequent correction processes are performed, the retry processor 282 calculates the correction values $V_{B1}$ and $V_{C1}$ on the basis of the following Expressions (4) and (5), respectively. In Expressions (4) and (5), a temperature coefficient at each level is added on the basis of Basic Expression (1).

$$V_{B1}=C \times (T_{coA}+T_{coB}) \times (T_N-T_{old}) \quad (4)$$

$$V_{C1}=C \times (T_{coA}+T_{coB}+T_{coC}) \times (T_N-T_{old}) \quad (5)$$

In Expressions (4) and (5), $T_{old}$ is the temperature [° C.] indicated by the temperature information during the first correction process which is stored in the storage 283. In addition, it is assumed that the value of C or the temperature coefficient in Expression (4) is set in advance on the basis of, for example, the tendency of temperature change, such that the corrected read voltage $V_B$ is positioned between the threshold value distributions (valley portions) of "01" and "10". Furthermore, it is assumed that the value of C or the temperature coefficient in Expression (5) is set in advance on the basis of, for example, the tendency of temperature change, such that the corrected read voltage $V_C$ is positioned between the threshold value distributions (valley portions) of "10" and "11".

The retry processor 282 calculates the correction values $V_{B1}$ and $V_{C1}$, on the basis of Expressions (4) and (5), respectively. Then, the retry processor 282 adds the correction values $V_{B1}$ and $V_{C1}$ to the read voltages $V_B$ and $V_C$ read from the storage 283 to correct the voltage values, respectively. Then, when the read voltage $V_A$ which has been detected by the full-level tracking and corrected on the basis of Basic Expression (1) and the read voltages $V_B$ and $V_C$ which have been corrected on the basis of Expressions (4) and (5), respectively, are set in the memory I/F 22, the retry processor 282 controls the decoder 26 such that soft-decision decoding is performed.

For example, when $T_{B1}$ is 80 [° C.], $T_N$ is 38 [° C.], $T_{old}$ is 43 [° C.], C is 5, $T_{coA}$ is 0.1, $T_{coB}$ is 0.2, and $T_{coC}$ 0.3, the correction value $V_{C1}$ during a retry process is calculated on the basis of the above-mentioned Expression (5) as follows:

$$V_{C1}=5 \times (0.1+0.2+0.3) \times (38-43) = -15.$$

As such, the retry processor 282 separately corrects the read voltages $V_B$ and $V_C$ with levels other than the reference level to appropriate voltage values at which the number of errors is the minimum. Therefore, it is possible to reduce the occurrence of a read error.

When the difference between the temperature $T_N$ and the first reference temperature $T_{B1}$ or the difference between the temperature $T_N$ and the temperature $T_{old}$ is less than a predetermined threshold value, correction may not be performed. In this structure, when it is determined that the temperature difference is less than the threshold value, the retry processor 282 sets each read voltage detected by the full-level tracking in the memory I/F 22 without any change. For example, when the threshold value is 5 [° C.] and the temperature difference $|T_N-T_B|$ (or $|T_N-T_{old}|$) is less than 5 [° C.], the retry processor 282 performs control such that correction is not performed.

Figure 5:
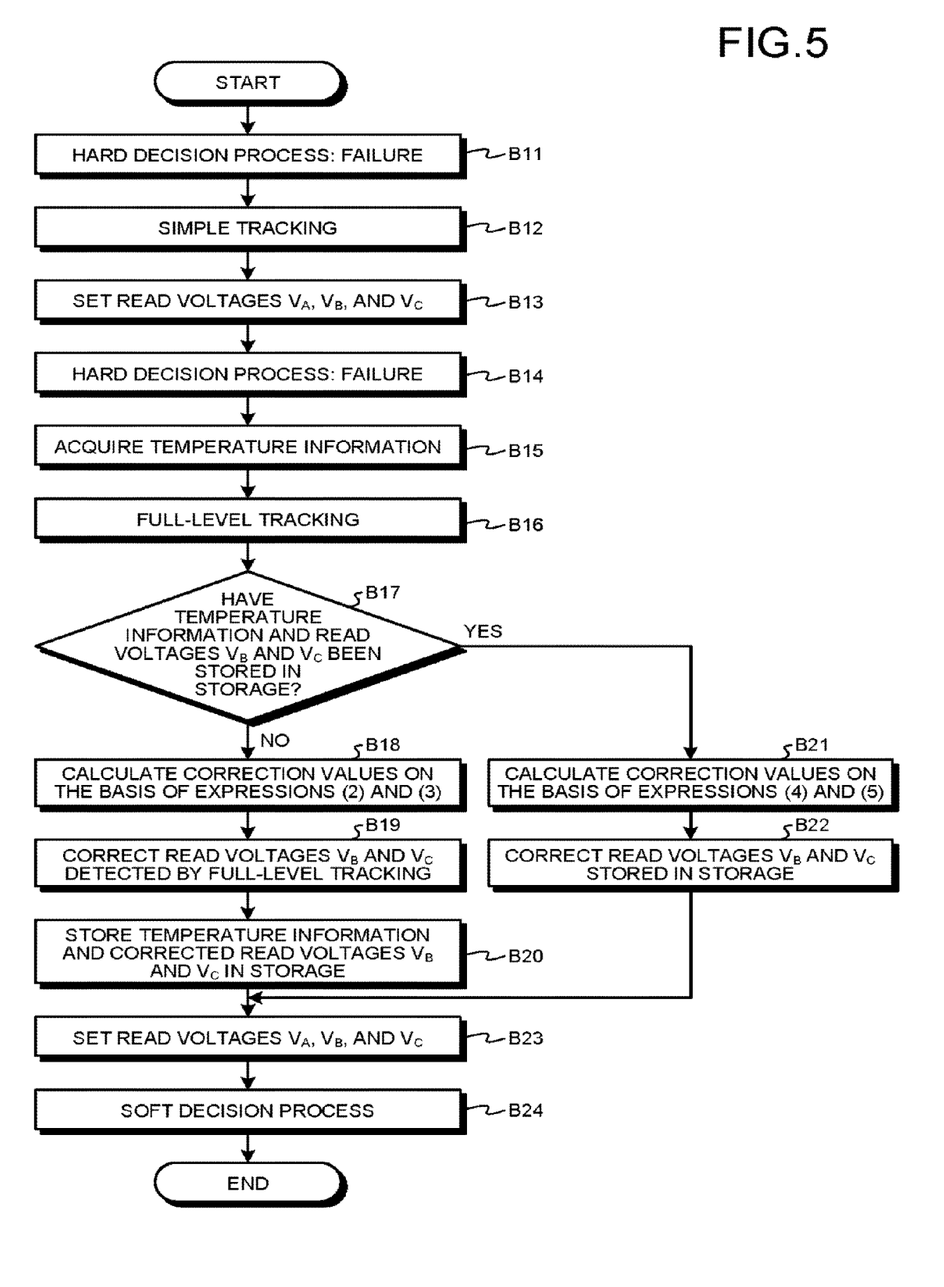
FIG. 5 is a flowchart illustrating an example of the procedure of a retry process according to the first embodiment.

Next, the retry process performed by the retry processor 282 according to this embodiment will be described with reference to FIG. 5. FIG. 5 is a flowchart illustrating an example of the procedure of the retry process.

First, when detecting that hard decision process has failed on the basis of the failure signal notified from the decoder 26 (B11), the retry processor 282 instructs the tracking processor 281 to perform simple tracking (B12).

The tracking processor 281 performs simple tracking to detect the read voltages $V_A$, $V_B$, and $V_C$ on the basis of Basic Expression (1). In the simple tracking of B12, the tracking processor 281 acquires the threshold value distribution of a specific level and estimates the threshold value distributions of other levels or the read voltages with other levels from, for example, the characteristics of the threshold value distribution of the specific level. Next, an example of the estimation method in the simple tracking will be described.

In the simple tracking, tracking for a specific level is performed from the threshold value distribution obtained by the distribution read process and shift values for other levels are acquired (estimated) by an operation on the basis of the shift value for the specific level. For example, when tracking for the level C is performed by the simple tracking, the shift values of the levels A and B are acquired on the basis of the shift value of the level C.

When linear approximation is used as the operation, the shift values $\Delta V_{A\_one}$ and $\Delta V_{B\_one}$ of the read voltages $V_A$ and $V_B$ can be calculated by the following Expressions (6) and (7), respectively.

$$\Delta V_{A\_one} = A_{A\_C} \times \Delta V_{C\_one} + C_{A\_C} \qquad (6)$$

$$\Delta V_{B\_one} = A_{B\_C} \times \Delta V_{C\_one} + C_{B\_C} \qquad (7)$$

In Expressions (6) and (7), $A_{A\_C}$, $A_{B\_C}$, $C_{A\_C}$, and $C_{B\_C}$ are coefficients of a linear function related to the calculation of the shift values $\Delta V_{A\_one}$ and $\Delta V_{B\_one}$. In addition, $\Delta V_{C\_one}$ is the shift value of the read voltage $V_C$ specified by the simple tracking. Values obtained by respectively adding $\Delta V_{A\_one}$, $\Delta V_{B\_one}$, and $\Delta V_{C\_one}$ to voltage values (initial read voltages) for predetermined levels A, B, and C are detected as the read voltages $V_A$, $V_B$, and $V_C$ after the shift values are reflected.

For example, when $A_{A\_C}$ and $A_{B\_C}$ are 0.5, $\Delta V_{C\_one}$ is 4 [mV], $C_{A\_C}$ is 1, and $C_{B\_C}$ is 2, $\Delta V_{A\_one}$ and $\Delta V_{B\_one}$ are calculated on the basis of Expressions (6) and (7) as follows.

$$\Delta V_{A\_one} = 0.5 \times 4 + 1 = 3$$

$$\Delta V_{B\_one} = 0.5 \times 4 + 2 = 4$$

Then, the retry processor 282 sets, in the memory I/F 22, the read voltages $V_A$, $V_B$, and $V_C$ detected by the simple tracking in B12 (B13).

Then, when detecting that a hard decision process for the read voltages set in B13 has failed on the basis of the failure signal notified from the decoder 26 (B14), the retry processor 282 acquires temperature information from the temperature measurement unit 4 (B15). When the hard decision process for the read voltages set in B13 has succeeded, the retry processor 282 ends the process.

Then, the retry processor 282 instructs the tracking processor 281 to perform full-level tracking (B16). The tracking processor 281 performs the full-level tracking on the basis of Basic Expression (1) to detect the read voltages $V_A$, $V_B$, and $V_C$ with each level. Then, the retry processor 282 determines whether the temperature information and the read voltages $V_B$ and $V_C$ have been stored in the storage 283 (B17).

When it is determined that the temperature information and the read voltages $V_B$ and $V_C$ have not been stored in the storage 283 (B17: No), the retry processor 282 calculates the correction values $V_{B1}$ and $V_{C1}$, on the basis of Expressions (2) and (3), respectively (B18). Then, the retry processor 282 corrects the voltage values of the read voltages $V_B$ and $V_C$ detected by the full-level tracking in B16, on the basis of the correction values $V_{B1}$ and $V_C$ calculated in B18 (B19). The retry processor 282 stores the temperature information acquired in B15 and the corrected read voltages $V_B$ and $V_C$ in the storage 283 (B20) and proceeds to B23.

On the other hand, when it is determined in B17 that the temperature information and the read voltages $V_B$ and $V_C$ have been stored in the storage 283 (B17: Yes), the retry processor 282 calculates the correction values $V_{B1}$ and $V_{C1}$ on the basis of Expressions (4) and (5), respectively (B21). The retry processor 282 corrects the read voltages $V_B$ and $V_C$ read from the storage 283 with the correction values $V_{B1}$ and $V_{C1}$ calculated in B21 (B22) and proceeds to B23.

Then, in B23, the retry processor 282 sets, in the memory I/F 22, the read voltage $V_A$ detected by the full-level tracking in B16 and the read voltages $V_B$ and $V_C$ corrected in B19 or B22 (B23). Then, the retry processor 282 instructs the decoder 26 to perform soft decision process (B24) and ends the process.

In this embodiment, the correction values $V_{B1}$ and $V_{C1}$ for the second and subsequent correction processes are calculated on the basis of Expressions (4) and (5). However, the embodiment is not limited thereto. The correction values may be calculated on the basis of Expressions (2) and (3) even in the second and subsequent correction processes. In this case, the temperature information and the read voltages $V_B$ and $V_C$ do not need to be stored in the storage 283. Therefore, the storage 283 may be removed from the read controller 28.

In the retry process illustrated in FIG. 5, the second and subsequent correction processes are unconditionally performed. However, the embodiment is not limited thereto. For example, the correction process may be performed when the difference between the temperature (temperature information) measured by the temperature measurement unit 4 and the temperature (temperature information) stored in the storage 283 is equal to or greater than a certain threshold value.

In addition, instead of the corrected read voltages $V_B$ and $V_C$, the correction values $V_{B1}$ and $V_{C1}$ calculated by Expressions (2) and (3) may be stored in the storage 283. When this structure is used, the retry processor 282 may calculate the correction values $V_{B1}$ and $V_{C1}$ for the second and subsequent correction processes, on the basis of the following Expressions (8) and (9).

$$V_{B1new} = \alpha \times V_{B1old} \tag{8}$$

$$V_{C1new} = \alpha \times V_{C1old} \tag{9}$$

In Expressions (8) and (9), $V_{B1new}$ and $V_{C1new}$ are correction values $V_{B1}$ and $V_{C1}$ which are newly calculated for the read voltages $V_B$ and $V_C$ and $V_{B1old}$ and $V_{C1old}$ are correction values $V_{B1}$ and $V_{C1}$ for initial correction which are stored in the storage 283. In addition, $\alpha$ is a coefficient for converting the correction values $V_{B1old}$ and $V_{C1old}$ for initial correction into new correction values $V_{B1new}$ and $V_{C1new}$.

The coefficient $\alpha$ can be calculated as follows, using Expression (9) as an example. First, temperature information $T_{Nold}$ and the correction value $V_{C1old}$ for initial correction which are stored in the storage 283 has the relationship represented by the following Expression (10) from Expression (3).

$$V_{C1old} = C \times (T_{coA} + T_{coB} + T_{coC}) \times (T_{Nold} - T_{B1}) \tag{10}$$

Here, when $T_{Nold} - T_{B1}$ is TA, Expression (10) can be represented by Expression (11).

$$V_{C1old} = C \times (T_{coA} + T_{coB} + T_{coC}) \times TA \tag{11}$$

The correction value $V_{C1new}$ which is calculated in the second and subsequent correction process can be represented by the following Expression (12) on the basis of Expression (3) from the relation with the temperature $T_{Nnew}$ measured by the temperature measurement unit 4.

$$V_{C1new} = C \times (T_{coA} + T_{coB} + T_{coC}) \times (T_{Nnew} - T_{B1}) \tag{12}$$

Here, when the difference between the temperatures $T_{Nnew}$ and $T_{Nold}$ is defined as $\Delta T$, Expression (12) can be represented by Expression (13).

$$V_{C1new} = C \times (T_{coA} + T_{coB} + T_{coC}) \times (TA + \Delta T) \tag{13}$$

Then, when $V_{C1old}$ of Expression (11) and $V_{C1new}$ of Expression (13) are substituted into Expression (9), the coefficient $\alpha$ can be represented by $\Delta T$ and TA as illustrated in the following Expression (14).

$$\alpha = V_{C1new} / V_{C1old} \tag{14}$$
$$= (C \times (T_{coA} + T_{coB} + T_{coC}) \times (TA + \Delta T)) /$$
$$\quad (C \times (T_{coA} + T_{coB} + T_{coC}) \times TA)$$
$$= (TA + \Delta T) / TA$$
$$= 1 + (\Delta T / TA)$$

For example, when $T_{B1}$ is 80[° C.], $T_{Nold}$ is 40 [° C.], and $T_{Nnew}$ is 50 [° C.], $V_{C1old}$ and $V_{C1new}$ are calculated on the basis of Expressions (10) and (12) as follows.

$$V_{C1old} = C \times (T_{coA} + T_{coB} + T_{coC}) \times (40 - 80)$$

$$V_{C1new} = C \times (T_{coA} + T_{coB} + T_{coC}) \times (50 - 80)$$

In addition, $\alpha$ is calculated on the basis of the calculation results of $V_{C1old}$ and $V_{C1new}$ and Expression (14) as follows:

$$\alpha = (C \times (T_{coA} + T_{coB} + T_{coC}) \times (50 - 80)) /$$
$$\quad (C \times (T_{coA} + T_{coB} + T_{coC}) \times (40 - 80))$$
$$= (50 - 80) / (40 - 80)$$
$$= 3/4.$$

The retry processor 282 calculates the coefficient $\alpha$ from the temperature $T_{Nnew}$ acquired from the temperature measurement unit 4 and the temperature $T_{Nold}$ stored in the storage 283, on the basis of Expression (14). Then, the retry processor 282 multiplies the correction value $V_{C1old}$ stored in the storage 283 by the coefficient $\alpha$ to calculate the new correction value $V_{C1new}$. Then, the retry processor 282 corrects, for example, the read voltage $V_C$ set in the memory I/F 22 on the basis of the new correction value $V_{C1new}$.

In this way, it is possible to obtain the same effect as that in the above-described embodiment. In addition, when this structure is used, it is possible to reduce the amount of calculation for the new correction value $V_{C1new}$ and thus to improve the processing speed. In addition, the retry processor 282 may perform control such that correction is not performed when $\Delta T/TA$ is less than a certain threshold value.

Second Embodiment

Next, a second embodiment will be described. In the structure described in the first embodiment, the temperature information and the read voltages $V_B$ and $V_C$ are stored in the storage 283. In the second embodiment, a structure in which the read voltages $V_B$ and $V_C$ are stored in the storage 283 will be described. In the second embodiment, the same components as those in the first embodiment are denoted by the same reference numerals and the description thereof will not be repeated.

Figure 6:
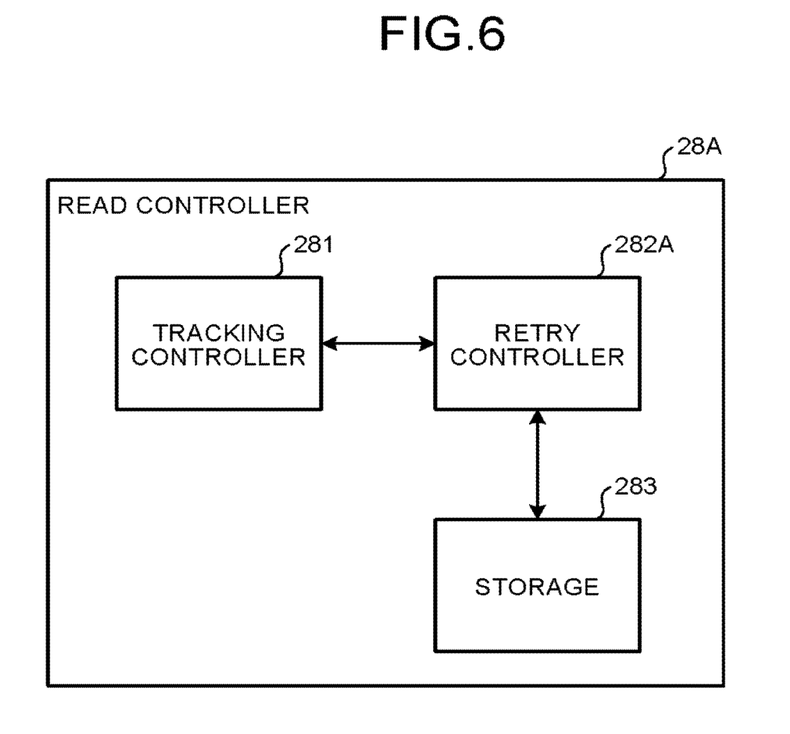
FIG. 6 is a diagram illustrating an example of the functional structure of a read controller according to a second embodiment.

FIG. 6 is a diagram illustrating an example of the functional structure of a read controller 28A according to the second embodiment. As illustrated in FIG. 6, the read controller 28A includes a tracking processor 281, a retry processor 282A, and a storage 283. The read controller 28A is a functional unit which corresponds to the read controller 28 described in the first embodiment.

Similarly to the retry processor 282, the retry processor 282A performs a retry process in cooperation with the tracking processor 281 when a decoder 26 fails in an error correction process.

Specifically, when a failure signal is notified from the decoder 26 after simple tracking, the retry processor 282A determines whether read voltages have been stored in the storage 283. When it is determined that the read voltage have been stored in the storage 283, that is, in the case of a first correction process, the retry processor 282A corrects read voltages $V_B$ and $V_C$ on the basis of Expressions (2) and (3), respectively, similarly to the first embodiment.

Then, the retry processor 282A converts correction values $V_{B1}$ and $V_{C1}$ into correction values $V_{B2}$ and $V_{C2}$ based on a second reference temperature, using the following Expressions (15) and (16).

$$V_{B2} = V_{B1} + (C \times (T_{coA} + T_{coB}) \times (T_N - T_{B2})) \tag{15}$$

$$V_{C2} = V_{C1} + (C \times (T_{coA} + T_{coB} + T_{coC}) \times (T_N - T_{B2})) \tag{16}$$

In Expressions (15) and (16), $T_{B2}$ is the second reference temperature [° C.]. In this embodiment, the second reference temperature $T_{B2}$ is an arbitrary value different from the first reference temperature $T_{B1}$. However, the embodiment is not limited thereto. For example, the second reference temperature $T_{B2}$ may be equal to the first reference temperature $T_{B1}$. In this case, the conversion with Expressions (15) and (16) is not needed and the results of Expressions (2) and (3) are used without any change.

Then, the retry processor 282A adds the correction values $V_{B2}$ and $V_{C2}$ calculated by Expressions (15) and (16) to the read voltages $V_B$ and $V_C$ detected by full-level tracking to correct the read voltages, respectively. Then, the retry processor 282A stores the read voltages $V_B$ and $V_C$ corrected on the basis of the correction values $V_{B2}$ and $V_{C2}$ in the storage 283.

On the other hand, when it is determined that the read voltages $V_B$ and $V_C$ have been stored in the storage 283, that is, in the case of the second and subsequent correction processes, the retry processor 282A calculates the correction values $V_{B2}$ and $V_{C2}$ on the basis of the following Expressions (17) and (18).

$$V_{B2}=C\times(T_{coA}+T_{coB})\times(T_N-T_{B2}) \quad (17)$$

$$V_{C2}=C\times(T_{coA}+T_{coB}+T_{coC})\times(T_N-T_{B2}) \quad (18)$$

For example, when $T_{B1}$ is 80 [° C.], $T_{B2}$ is 40[° C.], $T_N$ is 38 [° C.], C is 5, $T_{coA}$ is 0.1, $T_{coB}$ is 0.2, and $T_{coC}$ is 0.3, the correction value $V_{C1}$ during the first correction process is calculated on the basis of Expression (3) as follows:

$$V_{C1}=5\times(0.1+0.2+0.3)\times(38-80)=-126.$$

In addition, the correction value $V_{C2}$ during a retry process is calculated on the basis of Expression (18) as follows:

$$V_{C2}=5\times(0.1+0.2+0.3)\times(38-40)=-6.$$

The retry processor 282A adds the correction values $V_{B2}$ and $V_{C2}$ calculated by Expressions (17) and (18) to the read voltages $V_B$ and $V_C$ read from the storage 283 to correct the read voltages, respectively. Then, the retry processor 282A sets, in the memory I/F 22, the read voltage $V_A$ which has been detected by the full-level tracking and then corrected on the basis of Basic Expression (1) and the corrected read voltages $V_B$ and $V_C$ and controls the decoder 26 such that soft-decision decoding is performed.

As such, the retry processor 282A separately corrects the read voltages $V_B$ and $V_C$ (temperature correction) and locates the voltage values of the read voltages at valley positions of the original threshold value distribution. Therefore, it is possible to set a read voltage at which the number of errors is the minimum and thus to reduce the occurrence of a read error. In addition, it is possible to reduce the amount of information stored in the storage 283, as compared to the first embodiment in which the temperature information is stored in the storage 283. Therefore, it is possible to reduce the memory size of the storage 283. Furthermore, it is possible to correct the read voltage on the basis of an arbitrary temperature (second reference temperature $T_{B2}$). Therefore, it is possible to improve convenience.

Figure 7:
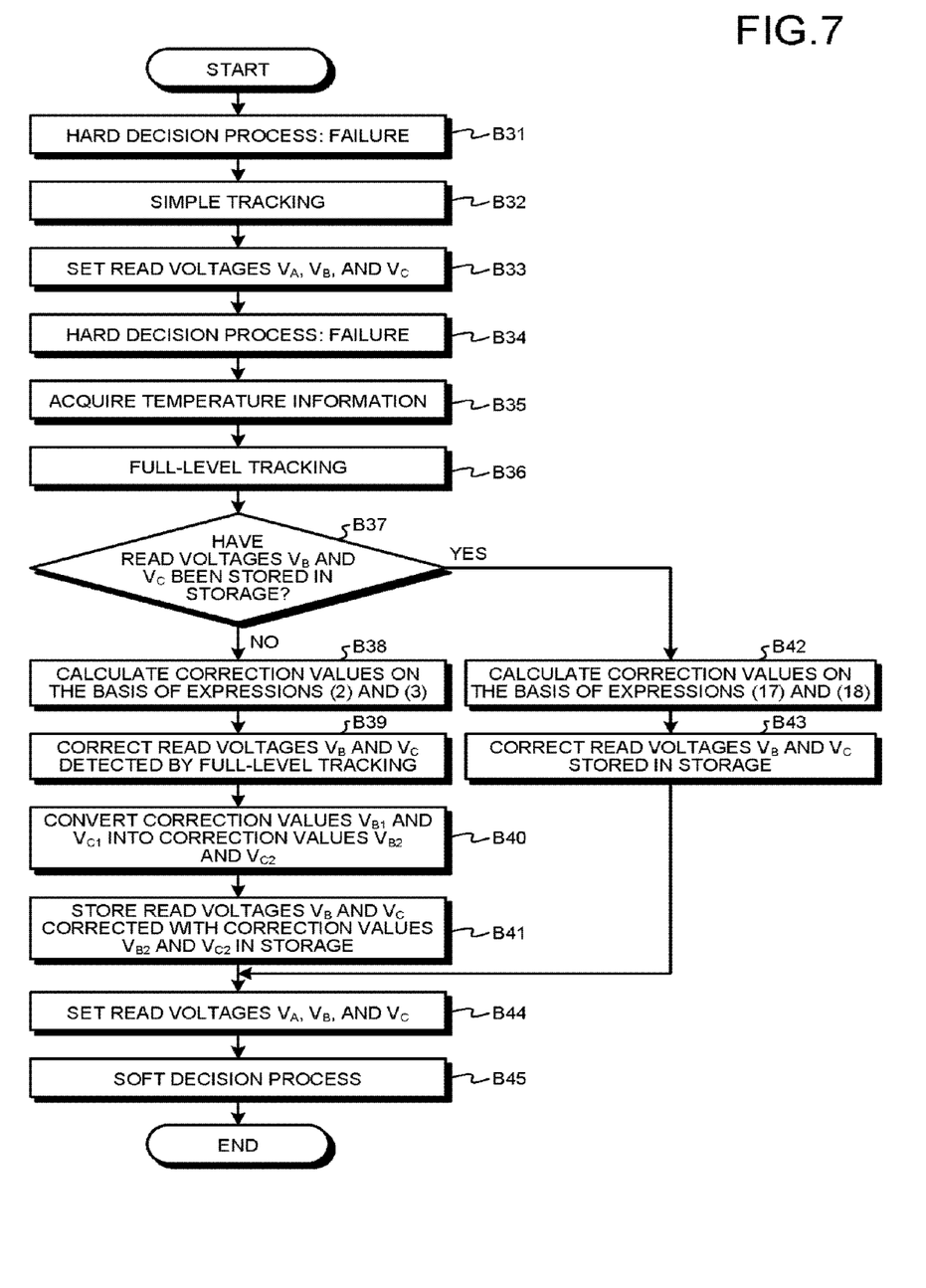
FIG. 7 is a flowchart illustrating an example of the procedure of a retry process according to the second embodiment.

Next, the retry process performed by the retry processor 282A according to this embodiment will be described with reference to FIG. 7. FIG. 7 is a flowchart illustrating an example of the procedure of the retry process. A process from B31 to B36 is the same as the process from B11 to B16 in the first embodiment and thus the description thereof will not be repeated.

In B37, the retry processor 282A determines whether the read voltages $V_B$ and $V_C$ have been stored in the storage 283 (B37). When it is determined that the read voltages $V_B$ and $V_C$ have not been stored in the storage 283 (B37: No), the retry processor 282A calculates the correction values $V_{B1}$ and $V_{C1}$ on the basis of Expressions (2) and (3), respectively (B38).

Then, the retry processor 282A corrects the read voltages $V_B$ and $V_C$ detected by full-level tracking in B36 on the basis of the correction values $V_{B1}$ and $V_{C1}$ calculated in B38, respectively (B39).

In addition, the retry processor 282A converts the correction values $V_{B1}$ and $V_{C1}$ calculated in B39 into the correction values $V_{B2}$ and $V_{C2}$ on the basis of Expressions (15) and (16), respectively (B40). Then, the retry processor 282A stores the read voltages $V_B$ and $V_C$ corrected on the basis of the correction values $V_{B2}$ and $V_{C2}$ in the storage 283 (B41) and proceeds to B44.

On the other hand, when it is determined in B37 that the read voltages $V_B$ and $V_C$ have been stored in the storage 283 (B37: Yes), the retry processor 282A calculates the correction values $V_{B2}$ and $V_{C2}$ on the basis of Expressions (17) and (18), respectively (B42). Then, the retry processor 282A corrects the read voltages $V_B$ and $V_C$ read from the storage 283 on the basis of the correction values $V_{B2}$ and $V_{C2}$, respectively (B43), and proceeds to B44.

Then, in B44, the retry processor 282A sets, in the memory I/F 22, the read voltage $V_A$ detected by the full-level tracking in B36 and the read voltages $V_B$ and $V_C$ corrected in B39 or B43 (B44). Then, the retry processor 282A instructs the decoder 26 to perform soft decision process (B45) and ends the process.

While certain embodiments have been described, these embodiments have been presented by way of example only, and are not intended to limit the scope of the inventions. Indeed, the novel embodiments described herein may be embodied in a variety of other forms; furthermore, various omissions, substitutions, changes and combinations in the form of the embodiments described herein may be made without departing from the spirit of the inventions. The accompanying claims and their equivalents are intended to cover such forms or modifications as would fall within the scope and spirit of the inventions.

For example, in the above-described embodiments, the storage 283 is provided in the read controller 28 (28A). However, the embodiment is not limited thereto. The storage 283 may be provided outside the read controller 28 (28A). For example, the data buffer 27 may be used as the storage 283.

In the above-described embodiments, the retry processor 282 (282A) does not correct the read voltage $V_A$. However, the embodiment is not limited thereto. The voltages to be corrected may include the read voltage $V_A$. In this case, a correction value related to the correction of the read voltage $V_A$ may be calculated on the basis of, for example, Basic Expression (1).

In the above-described embodiments, the retry processor 282 (282A) corrects the read voltage in which the shift value is reflected (temperature correction). However, the embodiment is not limited thereto. The temperature correction may be performed for the shift value. In this case, the retry processor 282 (282A) can add the corrected shift values to predetermined initial read voltages for the levels A, B, and C to calculate corrected read voltages.

In the above-described embodiments, a 2-bit cell is given as an example. However, the embodiment is not limited thereto. For example, the non-volatile memory 3 may include a single level cell (SLC) or an MLC which can have a bit value equal to or greater than 2 bits.

In the above-described embodiments, the retry processor 282 (282A) corrects the read voltage detected by full-level tracking. However, the embodiment is not limited thereto. The retry processor 282 (282A) may correct the read voltage detected by simple tracking. Next, an aspect in which the read voltage detected by simple tracking is corrected will be described.

Figure 8:
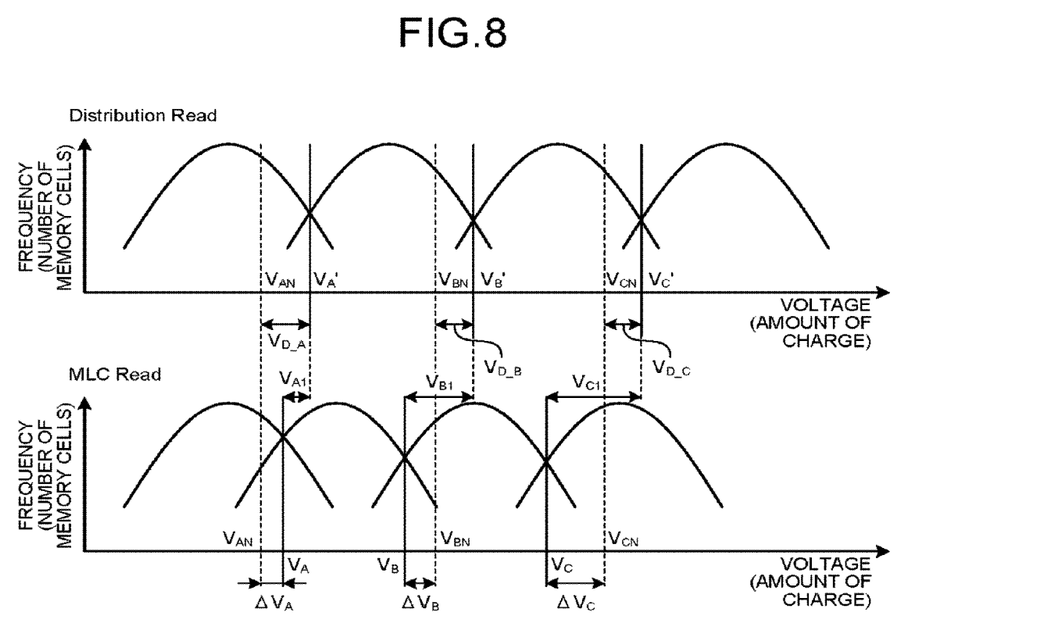
FIG. 8 is a diagram schematically illustrating an example of a threshold value distribution.

FIG. 8 is a diagram schematically illustrating an example of the threshold value distribution. In FIG. 8, the upper waveform indicates a threshold value distribution obtained by the distribution read process and the lower waveform indicates a threshold value distribution obtained by an MLC read process. In addition, $V_{AN}$, $V_{BN}$, and $V_{CN}$ are initial read voltages with each level. Furthermore, $V_A'$, $V_B'$, and $V_C'$ are optimum read voltages as viewed from the threshold value distribution obtained by the distribution read process. $V_A$, $V_B$, and $V_C$ are read voltages with each level which are obtained by the MLC read process and correspond to valleys in the "original threshold value distribution".

When the difference between $V_A'$ and $V_{AN}$ is $V_{D\_A}$, the difference between $V_A'$ and $V_A$ is $V_{A1}$, and the difference between $V_A$ and $V_{AN}$ (the difference between $V_{D\_A}$ and $V_{A1}$) is $\Delta V_A$, $V_A$ is represented by the following Relational Expression (19).

$$V_A = V_A' - V_{A1} = (V_{AN} + V_{D\_A}) - V_{A1} = V_{AN} + (V_{D\_A} - V_{A1}) = V_{AN} + \Delta V_A \quad (19)$$

In addition, similarly, $V_B$ and $V_C$ are represented by the following Relational Expressions (20) and (21), respectively.

$$V_B = V_B' - V_{B1} = (V_{BN} + V_{D\_B}) - V_{B1} = V_{BN} + (V_{D\_B} - V_{B1}) = V_{BN} + \Delta V_B \quad (20)$$

$$V_C = V_C' - V_{C1} = (V_{CN} + V_{D\_C}) - V_{C1} = V_{CN} + (V_{D\_C} - V_{C1}) = V_{CN} + \Delta V_C \quad (21)$$

Then, the shift value ($\Delta V_{C\_one} = \Delta V_C$) of the level C is obtained by simple tracking on the basis of the threshold value distribution obtained by the distribution read process illustrated in FIG. 8. In this case, the shift values ($\Delta V_{A\_one}$ and $\Delta V_{B\_one}$) of the levels A and B can be represented by the following Expressions (22) and (23) on the basis of Expressions (6) and (7).

$$\Delta V_{A\_one} = A_{A\_C} \times \Delta V_C + C_{A\_C} \quad (22)$$

$$\Delta V_{B\_one} = A_{B\_C} \times \Delta V_C + C_{B\_C} \quad (23)$$

Expression (22) can change to the following Expression (24) from the relationship between $\Delta V_C$ and ($V_{D\_C} - V_{C1}$).

$$\Delta V_{A\_one} = A_{A\_C} \times (V_{D\_C} - V_{C1}) + C_{A\_C} = A_{A\_C} V_{D\_C} - A_{A\_C} V_{C1} + C_{A\_C} \quad (24)$$

When Expression (5) is applied to $V_{C1}$, $\Delta V_{A\_one}$ is represented by the following Expression (25).

$$\Delta V_{A\_one} = A_{A\_C} V_{D\_C} + C_{A\_C} - A_{A\_C} (C \times (T_{coA} + T_{coB} + T_{coC}) \times (T_N - T_{B3})) \quad (25)$$

Here, $T_{B3}$ is a predetermined temperature for simple tracking and a calculation formula for simple tracking is optimized by $T_{B3}$.

Similarly, $\Delta V_{B\_one}$ and $\Delta V_{C\_one}$ are represented by the following Expressions (26) and (27).

$$\Delta V_{B\_one} = A_{B\_C} V_{D\_C} + C_{B\_C} - A_{B\_C} (C \times (T_{coA} + T_{coB} + T_{coC}) \times (T_N - T_{B3})) \quad (26)$$

$$\Delta V_{C\_one} = V_{D\_C} - C \times (T_{coA} + T_{coB} + T_{coC}) \times (T_N - T_{B3}) \quad (27)$$

The retry processor 282 (282A) separately calculates the corrected read voltages $V_{A\_one}$, $V_{B\_one}$, and $V_{C\_one}$ on the basis of the following Expressions (28), (29), and (30), respectively.

$$V_{A\_one} = V_{AN} + \Delta V_{A\_one} \quad (28)$$
$$= V_{AN} + A_{A\_C} V_{D\_C} + C_{A\_C} - A_{A\_C} (C \times (T_{coA} + T_{coB} + T_{coC}) \times (T_N - T_{B3})) - C \times T_{coA} \times (T_{B3} - T_{B1})$$

$$V_{B\_one} = V_{BN} + \Delta V_{B\_one} \quad (29)$$
$$= V_{BN} + A_{B\_C} V_{D\_C} + C_{B\_C} - A_{B\_C} (C \times (T_{coA} + T_{coB} + T_{coC}) \times (T_N - T_{B3})) - C \times (T_{coA} + T_{coB}) \times (T_{B3} - T_{B1})$$

$$V_{C\_one} = V_{CN} + \Delta V_{C\_one} \quad (30)$$
$$= V_{CN} + V_{D\_C} - C \times (T_{coA} + T_{coB} + T_{coC}) \times (T_N - T_{B3}) - C \times (T_{coA} + T_{coB} + T_{coC}) \times (T_{B3} - T_{B1})$$
$$= V_{CN} + V_{D\_C} + (T_{coA} + T_{coB} + T_{coC}) \times (-C \times (T_N - T_{B3}) - C \times (T_{B3} - T_{B1}))$$

Each coefficient used in Expressions (28), (29), and (30) is predetermined such that the corrected read voltages $V_{A\_one}$, $V_{B\_one}$, and $V_{C\_one}$ become $V_A$, $V_B$, and $V_C$ illustrated in FIG. 8, respectively. In the above-mentioned retry process, when correction is performed on the basis of the detection result of simple tracking, for example, the retry processor 282 performs B15 after B12 in the retry process illustrated in FIG. 5. Then, the retry processor 282 calculates $\Delta V_{A\_one}$, $\Delta V_{B\_one}$, and $\Delta V_{C\_one}$ in B18 and performs correction based on Expressions (28), (29), and (30) in B19. Therefore, it is possible to separately correct the read voltages $V_B$ and $V_C$ detected by simple tracking and thus to obtain the same effect as that in the above-described embodiments.

What is claimed is:

1. A storage device comprising:
   a non-volatile memory including a plurality of memory cells, each of the memory cells configured to store data having a plurality of bit values;
   a temperature acquiring processor configured to acquire a temperature of the non-volatile memory or an ambient temperature of the non-volatile memory;
   a distribution acquiring processor configured to acquire a threshold voltage distribution by reading data from the memory cells a plurality of times with a different voltage applied to the memory cells each time, the threshold voltage distribution indicating a relationship between the applied voltage and a number of the memory cells in which the applied voltage is a threshold voltage corresponding to each bit value of the data;
   a detector configured to detect, as a read voltage for each bit value of the data, a voltage with which the number of the memory cells whose threshold voltage is the voltage is the smallest among the different voltage applied the plurality of times, based on the threshold voltage distribution; and
   a read voltage correcting processor configured to calculate a correction value for each bit value based on the temperature acquired by the temperature acquiring processor, and correct, using the correction value, the read voltage detected by the detector for each bit value.

2. The device according to claim 1,
   wherein the read voltage correcting processor is configured to correct the read voltage based on a correction value corresponding to a difference between the temperature acquired by the temperature acquiring processor and a first reference temperature.

3. The device according to claim 2, further comprising:
a storage configured to store a parameter which is used by the read voltage correcting processor to perform the correction,
wherein the read voltage correcting processor is further configured to perform the correction using the parameter stored in the storage.

4. The device according to claim 3,
wherein the storage is further configured to store the read voltage corrected by the read voltage correcting processor and the temperature acquired by the temperature acquiring processor during the correction, and
the read voltage correcting processor is further configured to correct the read voltage stored in the storage based on a correction value corresponding to a difference between the temperature stored in the storage and the temperature acquired by the temperature acquiring processor.

5. The device according to claim 3,
wherein the storage is further configured to store stores the correction value which has been used by the read voltage correcting processor to correct the read voltage and the temperature acquired by the temperature acquiring processor during the correction, and
the read voltage correcting processor is further configured to calculate another correction value from the correction value stored in the storage, based on a difference between the temperature stored in the storage and the temperature acquired by the temperature acquiring processor.

6. The device according to claim 3,
wherein the storage is further configured to store the read voltage corrected by the read voltage correcting processor, and
the read voltage correcting processor is further configured to correct corrects the read voltage stored in the storage based on the correction value corresponding to the difference between the first reference temperature and the temperature acquired by the temperature acquiring processor.

7. The device according to claim 3, further comprising:
a converter configured to convert the correction value which is calculated based on the first reference temperature into a correction value which is based on a second reference temperature different from the first reference temperature,
wherein the storage is further configured to store the correction value converted by the converter, and
the read voltage correcting processor is further configured to calculate another correction value from the correction value stored in the storage, based on a difference between the second reference temperature and the temperature acquired by the temperature acquiring processor.

8. The device according to claim 1,
wherein the distribution acquiring processor is further configured to acquire the threshold voltage distribution for a first bit value among the plurality of bit values, and
the detector is further configured to detect a read voltage for the first bit value based on the acquired threshold voltage distribution, and calculate a read voltage for another bit value based on the read voltage for the first bit value.

9. The device according to claim 1,
wherein the distribution acquiring processor is further configured to acquire the threshold voltage distribution for each bit value of the plurality of bit values, and
the detector is further configured to detect a read voltage for each bit value based on each acquired threshold voltage distribution.

10. The device according to claim 1, further comprising:
a decoder configured to perform error correction for data read from the non-volatile memory using the read voltage detected by the detector,
wherein the read voltage correcting processor is configured to correct the read voltage when the error correction by the decoder has failed.

11. The device according to claim 10,
wherein the decoder is configured to perform, using the read voltage detected by the detector, a hard decision process on the data read from the non-volatile memory.

12. A read retry method performed by a storage device, the storage device including a non-volatile memory, the non-volatile memory including a plurality of memory cells, each of the memory cells configured to store data having a plurality of bit values, the read retry method comprising:
acquiring a temperature of the non-volatile memory or an ambient temperature of the non-volatile memory;
acquiring a threshold voltage distribution by reading data from the memory cells a plurality of times with a different voltage applied to the memory cells each time, the threshold voltage distribution indicating a relationship between the applied voltage and a number of the memory cells in which the applied voltage is a threshold voltage corresponding to each bit value of the data;
detecting, as a read voltage, for each bit value of the data, a voltage with which the number of the memory cells whose threshold voltage is the voltage is the smallest among the different voltage applied the plurality of times, based on the threshold voltage distribution; and
calculating a correction value for each bit value based on the acquired temperature, and correcting, using the correction value, the detected read voltage for each bit value.

13. The method according to claim 12,
wherein, in the correction of the read voltage, the read voltage is corrected based on a correction value corresponding to a difference between the acquired temperature and a first reference temperature.

14. The method according to claim 13, further comprising:
storing a parameter which is used to correct the read voltage in a storage,
wherein, in the correction of the read voltage, correction is performed using the parameter stored in the storage.

15. The method according to claim 14,
wherein the corrected read voltage the temperature acquired during the correction are stored in the storage, and
in the correction of the read voltage, the read voltage stored in the storage is corrected based on a correction value corresponding to a difference between the temperature stored in the storage and the acquired temperature.

16. The method according to claim 14,
wherein the correction value which has been used to correct the read voltage and the temperature acquired during the correction are stored in the storage, and
in the correction of the read voltage, another correction value is calculated from the correction value stored in the storage, based on a difference between the temperature stored in the storage and the acquired temperature.

17. The method according to claim 14,
wherein the corrected read voltage is stored in the storage, and
in the correction of the read voltage, the read voltage stored in the storage is corrected based on the correction value corresponding to the difference between the first reference temperature and the acquired temperature.

18. The method according to claim 12, further comprising:
acquiring the threshold voltage distribution for a first bit value among the plurality of bit values; and
detecting a read voltage for the first bit value based on the acquired threshold voltage distribution, and calculating a read voltage for another bit value based on the read voltage for the first bit value.

19. The method according to claim 12, further comprising:
acquiring the threshold voltage distribution for each bit value of the plurality of bit values; and
detecting a read voltage for each bit value based on each acquired threshold voltage distribution.

20. The method according to claim 12, further comprising:
performing error correction for data read from the non-volatile memory using the detected read voltage,
correcting the read voltage when the error correction has failed.

* * * * *